US011275118B2

(12) United States Patent
Miftahullatif et al.

(10) Patent No.: US 11,275,118 B2
(45) Date of Patent: Mar. 15, 2022

(54) BATTERY ESTIMATION SYSTEM, BATTERY ESTIMATION METHOD, AND STORAGE MEDIUM

(71) Applicant: Hitachi, Ltd., Tokyo (JP)

(72) Inventors: Emhabayu Miftahullatif, Tokyo (JP); Toru Kouno, Tokyo (JP)

(73) Assignee: HITACHI, LTD., Tokyo (JP)

( * ) Notice: Subject to any disclaimer, the term of this patent is extended or adjusted under 35 U.S.C. 154(b) by 8 days.

(21) Appl. No.: 16/822,405

(22) Filed: Mar. 18, 2020

(65) Prior Publication Data

US 2020/0341064 A1 Oct. 29, 2020

(30) Foreign Application Priority Data

Apr. 24, 2019 (JP) .............................. JP2019-082474

(51) Int. Cl.
*G01R 31/367* (2019.01)
*G01R 31/382* (2019.01)
*H01M 10/48* (2006.01)
*H01M 50/20* (2021.01)

(52) U.S. Cl.
CPC ......... *G01R 31/367* (2019.01); *G01R 31/382* (2019.01); *H01M 10/486* (2013.01); *H01M 50/20* (2021.01); *H01M 2220/20* (2013.01)

(58) Field of Classification Search
None
See application file for complete search history.

(56) References Cited

U.S. PATENT DOCUMENTS

2011/0239445 A1 10/2011 Ibi et al.

FOREIGN PATENT DOCUMENTS

JP 2005149793 A * 6/2005
JP 2011-216328 A 10/2011

OTHER PUBLICATIONS

Panchal (Experimental Investigation and Modeling of Lithium-ion Battery Cells and Packs for Electric Vehicles, 2016, University of Ontario Institute of Technology, p. 1-196) (Year: 2016).*
Thomas et al. "Study of Space Battery Accelerated Testing Techniques Phase 1 Report Survey of Testing Methods Applicable to Space Battery Evaluation", 1968, NASA (Year: 1968).*

* cited by examiner

Primary Examiner — Roy Y Yi
(74) Attorney, Agent, or Firm — Miles & Stockbridge, P.C.

(57) ABSTRACT

Provided is a battery estimation system comprising a processor and a storage device coupled to the processor. The storage device stores accelerated test data obtained by measuring change in degree of deterioration of a rechargeable battery cell at a predetermined temperature. The processor calculates a relationship between the temperature and the magnitude of an activation energy of the rechargeable battery cell on the basis of the accelerated test data, calculates a temperature as a maximum temperature on the basis of the relationship between the temperature and the magnitude of the activation energy of the rechargeable battery cell, the calculated temperature being a temperature at which the magnitude of the activation energy changes from decreasing to increasing in response to increase in the temperature, and determines a temperature equal to or less than the maximum temperature as a temperature to be used in an accelerated test.

12 Claims, 7 Drawing Sheets

BATTERY ESTIMATION SYSTEM, BATTERY ESTIMATION METHOD, AND STORAGE MEDIUM

CLAIM OF PRIORITY

The present application claims priority from Japanese patent application JP2019-082474 filed on Apr. 24, 2019, the content of which is hereby incorporated by reference into this application.

BACKGROUND OF THE INVENTION

The present invention relates to a technique of reusing a rechargeable battery.

The growth of an electric vehicle (EV) market has provided an opportunity to reuse rechargeable batteries in an accumulator battery system other than an EV after the rechargeable batteries is used in the EV. To judge the availability of the rechargeable batteries collected from EVs in the accumulator battery system for a different purpose, the collected rechargeable batteries are required to be estimated in terms of a present state and time to end of its life.

For example, JP 2011-216328 A (Patent Document 1) discloses a technique relating to estimation of a second-life rechargeable battery. Patent Document 1 states that, in reusing cells and the like constituting a collected assembled battery, a defective part such as a cell is eliminated as follows: "The assembled battery is collected from a market and disassembled into each battery module. Battery properties such as an open-end voltage are sorted using an absolute permissible range and a relative permissible range and a new assembled battery is rebuilt. The relative permissible range is a permissible range set for each assembled battery and is set with respect to an average of a battery property distribution."

SUMMARY OF THE INVENTION

To judge whether a rechargeable battery collected after being used is reusable for a different purpose, this rechargeable battery is required to be estimated in terms of a present state and a residual lifetime and the like. These properties depend on a way in which the rechargeable battery was used before the collection. In some cases, however, information about usage history of a rechargeable battery may be generally unavailable. In such cases, an accelerated test is conducted on a collected rechargeable battery to allow presumption of the rechargeable battery in terms of a present state, a residual lifetime and the like. In this regard, a situation of usage in the past differs between collected rechargeable battery sets. Hence, conducting an accelerated test on each set involves a great deal of time and a heavy workload.

In order to solve at least one of the foregoing problems, the present invention provides a battery estimation system comprising a processor and a storage device coupled to the processor, wherein the storage device stores accelerated test data obtained by measuring change in degree of deterioration of a rechargeable battery cell at a predetermined temperature, wherein the processor is configured to: calculate a relationship between the temperature and the magnitude of an activation energy of the rechargeable battery cell on the basis of the accelerated test data; calculate a temperature as a maximum temperature on the basis of the relationship between the temperature and the magnitude of the activation energy of the rechargeable battery cell, the calculated temperature being a temperature at which the magnitude of the activation energy changes from decreasing to increasing in response to increase in the temperature; and determine a temperature equal to or less than the maximum temperature as a temperature to be used in an accelerated test.

According to one aspect of the present invention, the performance of a second-life rechargeable battery set with unknown usage history can be estimated with a favorable degree of accuracy in a short time with a light workload.

Problems to be solved, structures, and effects other than those mentioned above become apparent from the following description of an embodiment.

DETAILED DESCRIPTION OF THE EMBODIMENT

Figure 1:
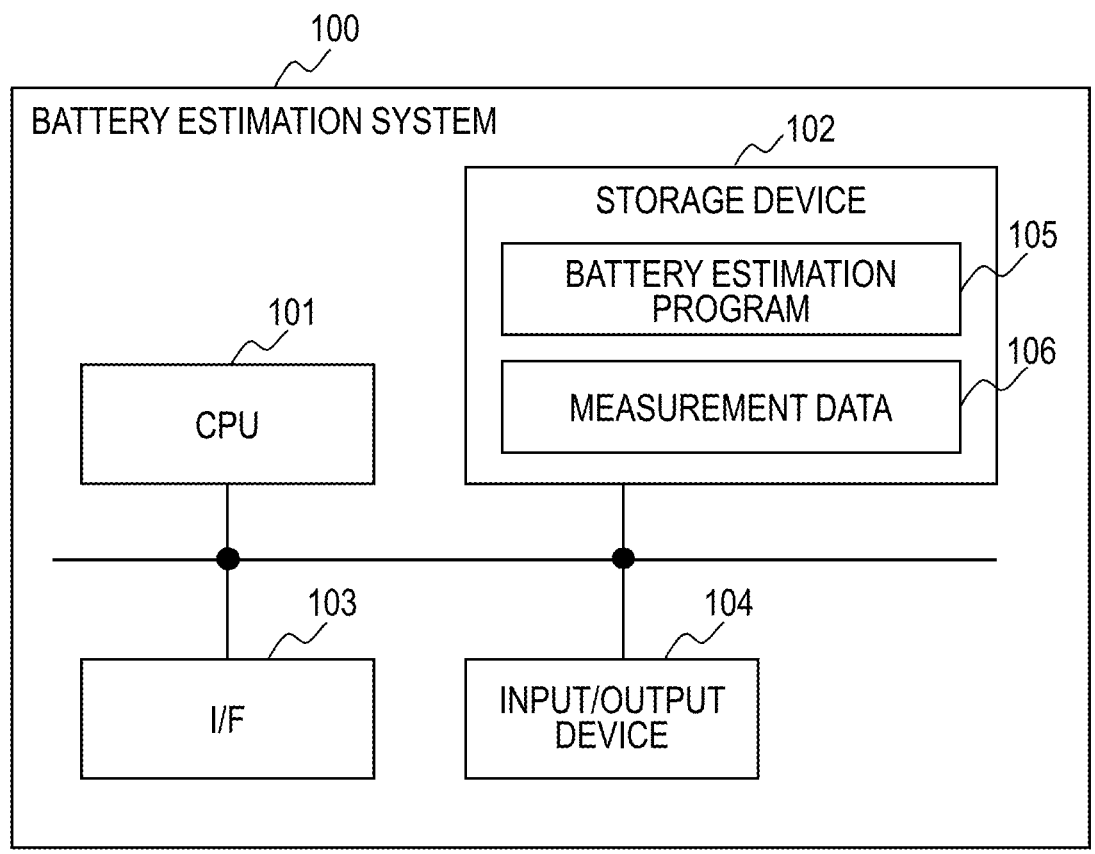
FIG. 1 is a block diagram showing the configuration of a battery estimation system according to an embodiment of the present invention.

An embodiment of the present invention will be described below by referring to the drawings.

FIG. 1 is a block diagram showing the configuration of a battery estimation system according to an embodiment of the present invention.

A battery estimation system 100 of the embodiment is a computer system including a CPU 101, a storage device 102, an interface (I/F) 103, and an input/output device 104 connected to each other.

The CPU 101 is a processor that performs various types of processes described below by following a program stored in the storage device 102. The storage device 102 stores the program to be executed by the CPU 101 and data to be referred to by the CPU 101 in performing the various types of processes. The storage device 102 may include a main storage device such as a dynamic random access memory (DRAM) and an auxiliary storage device such as a hard disk drive or a flash memory.

The storage device 102 of the embodiment stores a battery estimation program 105 and measurement data 106. In the following description, processes performed by the battery estimation system 100 are realized by execution of the battery estimation program by the CPU 101.

The I/F 103 makes communication with a device outside the battery estimation system 100. For example, a measurement device 303 (FIG. 3B) described later may be connected to the I/F 103. In this case, the battery estimation system 100 may acquire a result of a test through the I/F 103 conducted on a battery by the measurement device 303, and store the result as the measurement data 106 into the storage device 102.

The input/output device 104 is a device for input of information from a user of the battery estimation system 100 (for example, a worker to estimate a battery, for example) and output of information to the user. As an example, the input/output device 104 includes an input device such as a keyboard and a pointing device, and an output device such as an image display device. Alternatively, the input/output device 104 may be configured as what is called a touch screen, for example, in which an input device and an output device are integrated with each other.

Figure 2:
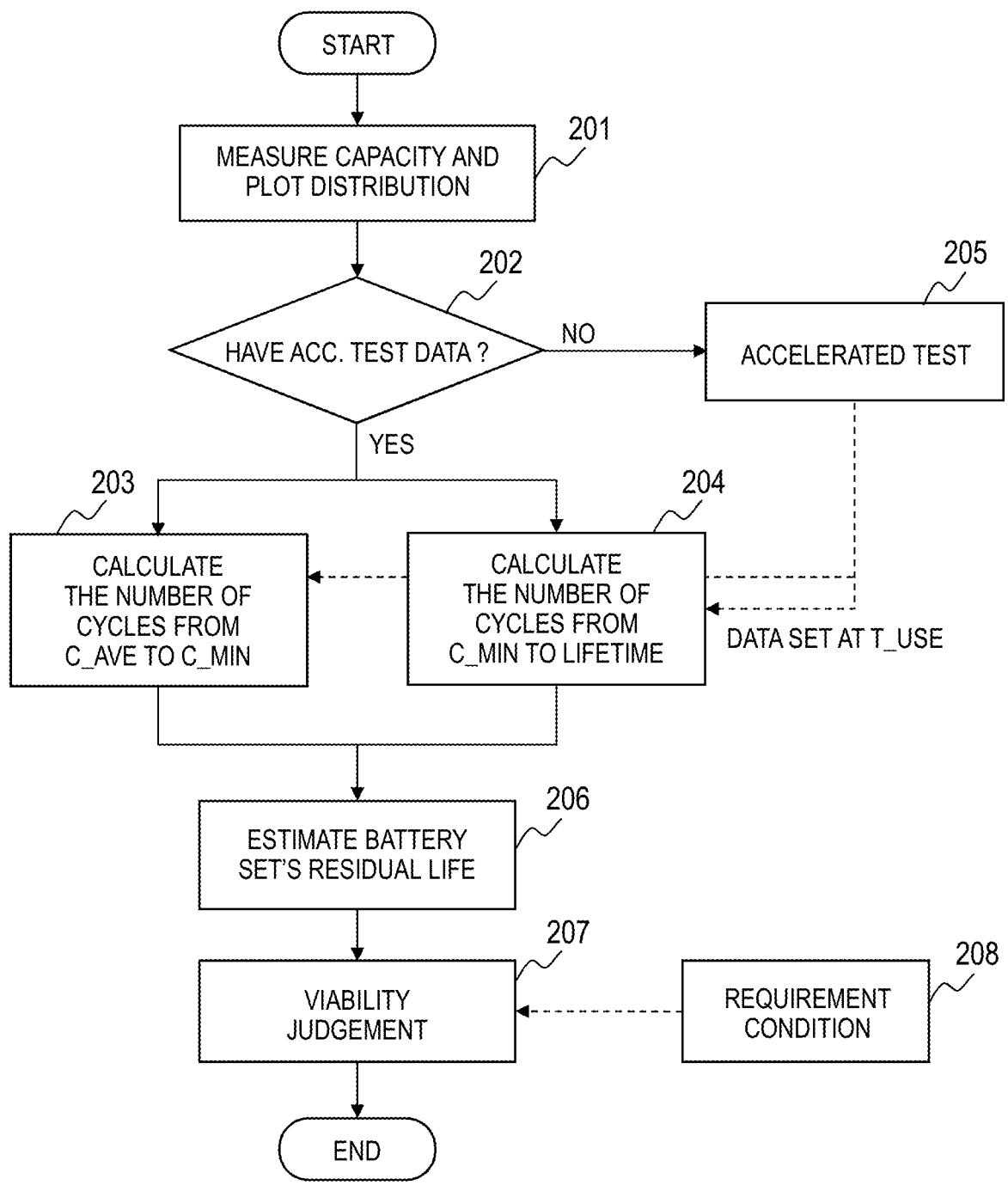
FIG. 2 is a flowchart showing an algorithm of a process performed in the embodiment of the present invention.

FIG. 2 is a flowchart showing an algorithm of a process performed in the embodiment of the present invention.

First, the present capacities of a plurality of battery cells in a battery set as an estimation target are measured, and a distribution of the measured capacities is plotted (step 201). By using the plotted distribution, a minimum capacity C_min and an average capacity C_ave of the battery cells in the battery set are specified. Details of this procedure will be described later by referring to FIG. 3A to FIG. 3C.

Next, it is judged whether accelerated test data has already been available (step 202). This judgment may be made by a worker. Alternatively, this judgment may be made by the battery estimation system 100 on the basis of the presence or absence of applicable data in the storage device 102.

If accelerated test data has already been available, the battery estimation system 100 thereafter calculates a difference between the number of residual cycles of a battery cell with the average capacity C_ave and the number of residual cycles of a battery cell with the minimum capacity C_min (step 203), and calculates the number of residual cycles of the battery cell with the minimum capacity C_min (step 204). If accelerated test data has not yet been available, an accelerated test is conducted (step 205), and then steps 203 and 204 are performed. The number of residual cycles mentioned herein is the number of charge-discharge cycles showing the number of times a battery cell can be charged and discharged before it reaches an end of its life. Steps 203 to 205 will be described in detail later by referring to FIGS. 4 to 8.

Next, the battery estimation system 100 estimates time to an end of life (residual lifetime) of the battery set on the basis of a result of the foregoing calculations of the numbers of cycles (step 206). Further, the battery estimation system 100 judges the viability of the battery cell on the basis of a result of the estimation about time to an end of life obtained in step 206 and a predetermined requirement condition 208 (step 207). These procedures will be described in detail later by referring to FIG. 9A and FIG. 9B.

Figures 3A, 3B, 3C:
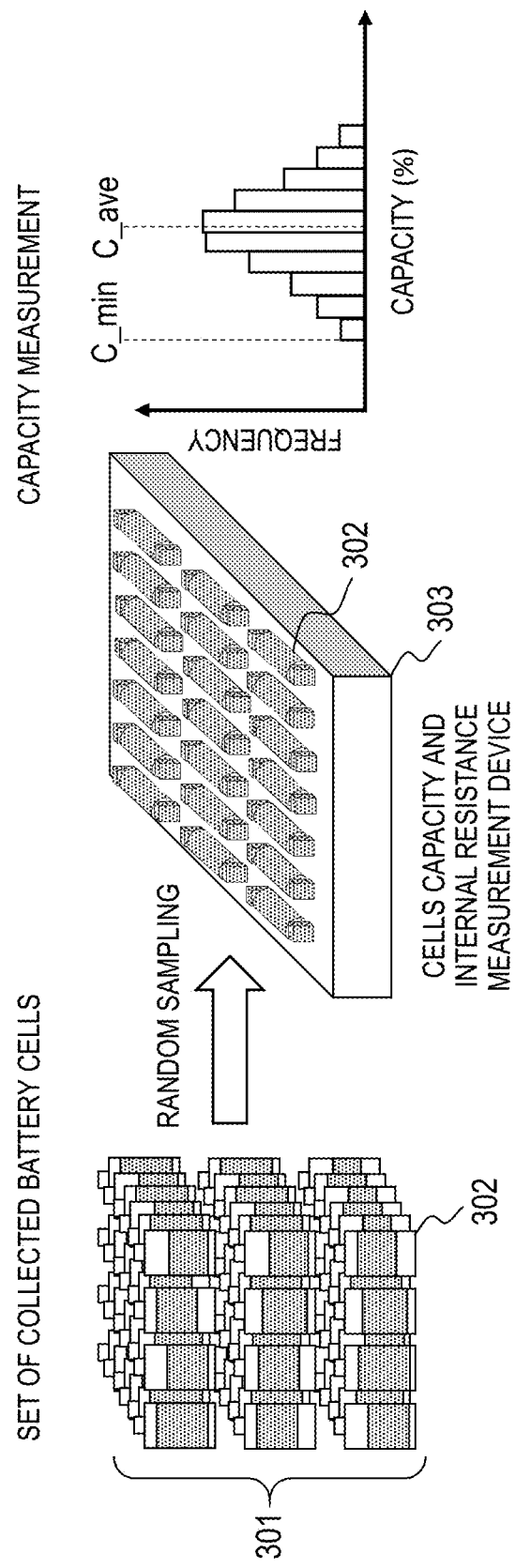
FIG. 3A to FIG. 3C are explanatory views showing measurement of capacities and a plot of a distribution of the measured capacities of battery cells in a battery set made in the embodiment of the present invention.

FIG. 3A to FIG. 3C are explanatory views showing measurement of the capacities and a plot of a distribution of the measured capacities of battery cells in a battery set made in the embodiment of the present invention.

As shown in FIG. 3A, for example, at least one battery set 301 including a plurality of battery cells 302 is given as an estimation target. The one battery set 301 may be a battery set used in one electric device of any type such as one EV (electric vehicle, not shown) and then collected. To judge whether the collected battery set 301 is reusable for a different purpose (such as a use in an accumulator battery system), for example, the battery set 301 is estimated. In this example, each battery cell 302 forming the battery set 301 is a lithium-ion rechargeable battery. However, this is merely an example and the present invention is applicable to a rechargeable battery of any type such as a lead battery or a nickel-hydrogen battery, for example.

As shown in FIG. 3B, the battery cells 302 taken out of the battery set 301 are fitted to the measurement device 303. The measurement device 303 measures the present capacity and internal resistance of each battery cell 302. According to a result of the measurement, a distribution of the capacities of the battery cells 302 in the battery set 301 is plotted, as shown in FIG. 3C. Regarding the graph in FIG. 3C, a horizontal axis shows the capacity of the battery cell 302, and a vertical axis shows the frequency of the battery cells 302 with corresponding capacities. A minimum capacity and an average capacity in the distribution obtained in this way are identified as C_min and C_ave respectively.

A target of the measurement by the measurement device 303 may be all the battery cells 302 in the battery set 301. Alternatively, this target may be some of these battery cells 302 (for example, some battery cells 302 selected randomly). Even if the target is some of all the battery cells 302, a distribution of the capacities of all the battery cells 302 in the battery set 301 can still be presumed by measuring a sufficient number of randomly selected battery cells 302, for example.

The foregoing measurement by the measurement device 303 can be made by causing a worker to operate the measurement device 303 directly. In this case, the worker may perform an operation of inputting a result of the measurement to the battery estimation system 100. The input measurement result is stored as the measurement data 106 into the storage device 102. In another case, the foregoing measurement may be made by connecting the battery estimation system 100 to the measurement device 303, and causing the battery estimation system 100 to control the measurement device 303 by following the battery estimation program 105. In this case, a result of the measurement may automatically be read into the battery estimation system 100 through the I/F 103, and the read measurement result may be stored as the measurement data 106 into the storage device 102.

The method described above is an example of presuming a distribution of degrees of deterioration of the battery cells 302 in the battery set 301. A method other than the foregoing method may be employed for presuming a distribution of degrees of deterioration of the battery cells 302. In the embodiment, a ratio of a present capacity to an initial capacity (what is called States of health, SOH) is measured as an index to a degree of deterioration of the battery cell 302, and a distribution of such ratios is presumed. An average capacity, a minimum capacity, etc. described below correspond to this ratio.

Figure 4:
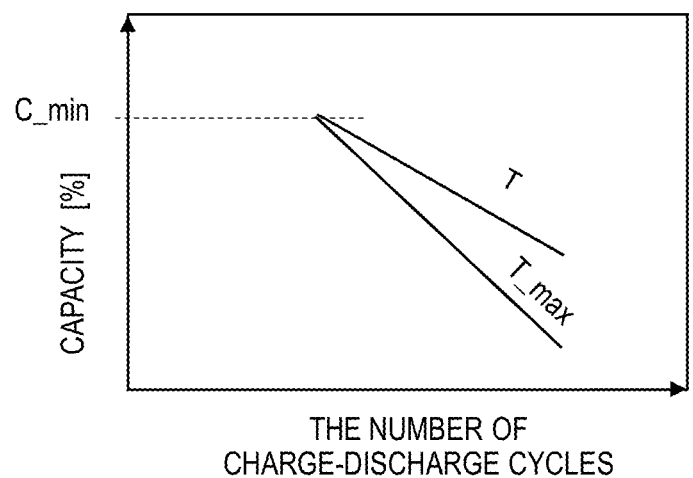
FIG. 4 is an explanatory view of a charge-discharge accelerated test conducted in the embodiment of the present invention.

FIG. 4 is an explanatory view of a charge-discharge accelerated test conducted in the embodiment of the present invention.

This accelerated test is conducted in step 205 in FIG. 2 by following a procedure described next. Two battery cells 302 having capacities at the minimum capacity C_min are extracted as samples from a plurality of battery cells 302.

The battery cell 302 having a capacity at the minimum capacity C_min may be the battery cell 302 having a capacity that is correctly at the at the minimum capacity C_min, alternatively, may be the battery cell 302 having a capacity that is approximately at the minimum capacity C_min (for example, the battery cell 302 belonging to a group of the smallest capacity as one of groups determined by measuring the capacities of the battery cells 302 and dividing the battery cells 302 according to a capacity rank).

Then, one of the battery cells 302 is placed at a temperature T_max and the other is placed at a temperature T lower than the temperature T_max. These battery cells 302 are charged and discharged repeatedly to measure their capacities and internal resistances.

The graph in FIG. 4 shows a relationship between the capacity (vertical axis) and the number of charge-discharge cycles (horizontal axis) of each of the samples obtained by the charge-discharge accelerated test conducted in the foregoing manner.

Here, T_max is a maximum temperature at which activation energy changes from decreasing to increasing.

Figure 5:
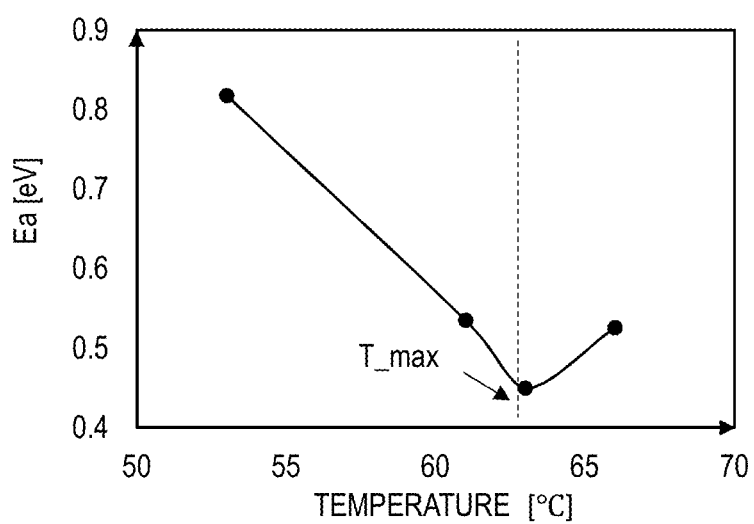
FIG. 5 is an explanatory view showing a relationship between activation energy and a temperature used in the embodiment of the present invention.

FIG. 5 is an explanatory view showing a relationship between activation energy and a temperature used in the embodiment of the present invention.

While an activation energy Ea of the battery cell 302 decreases with increase in a temperature, it changes to increasing over a certain temperature. This temperature is defined as T_max. In trying to estimate the length of time from when a chance failure period ends to when a wear-out failure period starts in the battery cell 302, an accelerated test is conducted for the purpose of shortening time required for the estimation. Generally, this time is shortened more at a higher temperature (namely, under application of higher stress). At a temperature after the acceleration energy Ea changes to increasing (namely, at a temperature exceeding T_max), however, an excessively stressed state occurs to cause development of deterioration differing from development generally caused. For this reason, setting a temperature exceeding T_max in the accelerated test is not appropriate.

In the embodiment, a higher one of temperatures set in the accelerated test is defined as T_max. While this higher temperature is not required to be T_max correctly, it is desirably as close as possible to T_max within a range lower than T_max. Setting a higher one of two temperatures to T_max or at a temperature close to T_max allows a lower temperature to be set to a temperature higher than degrees set in a conventional accelerated test. In this way, time required for the accelerated test is shortened. The following description is on the assumption that the higher temperature is set to T_max.

If T_max about a battery cell of the same species as the battery cell 302 as an estimation target has already been available, this value can be used for conducting the accelerated test. On the other hand, if T_max has not yet been available, the accelerated test is conducted in and T_max is calculated by the following method.

Figure 6:
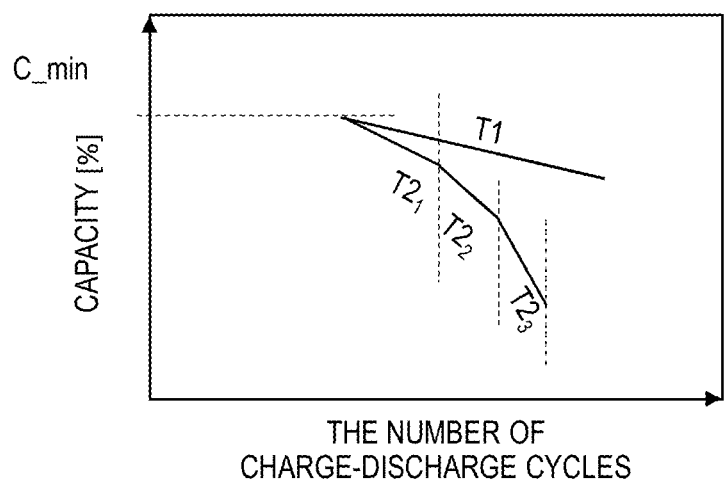
FIG. 6 is an explanatory view of a charge-discharge accelerated test conducted in the embodiment of the present invention in the absence of the maximum temperature T_max.

FIG. 6 is an explanatory view of a charge-discharge accelerated test conducted in the embodiment of the present invention in the absence of the maximum temperature T_max.

In the absence of T_max, the accelerated test is conducted while the extracted two samples are placed at two temperatures T1 and T2 (T1<T2) presumed to be lower than T_max.

In this case, T2 is increased stepwise while charging and discharging are repeated. With T2 in an initial stage defined as $T2_1$, for example, after the accelerated test is started, charging and discharging are performed to measure a capacity and an internal resistance while T2 is set sequentially to $T2_2$ higher than $T2_1$, then to $T2_3$ higher than $T2_2$, etc.

The graph in FIG. 6 shows a relationship between the capacity (vertical axis) and the number of charge-discharge cycles (horizontal axis) of each of the samples obtained by the charge-discharge accelerated test conducted in the foregoing manner. Regarding a sample placed at a temperature set to T2, a tilt of decreasing of a capacity relative to the number of charge-discharge cycles changes in response to temperature change from $T2_1$ to $T2_2$, then to $T2_3$, etc. On the basis of such a measurement result, the temperature activation energy Ea of the battery cell 302 is calculated using a formula (1) (Arrhenius' equation).

$$AF = \exp\left(\frac{Ea}{k}\left(\frac{1}{T} - \frac{1}{T\_max}\right)\right) \quad (1)$$

The foregoing formula (1) shows calculation using the temperatures T and T_max set in the manner shown in FIG. 4. If the temperatures T1 and T2 are set in the manner shown in FIG. 6, T and T_max are replaced with T1 and T2 respectively. On the basis of a result of the accelerated test, an acceleration factor AF is determined as a ratio between the numbers of charge-discharge cycles required for decreasing capacities at their temperatures by the same amount. In the formula (1), k is a Boltzman's constant.

Combinations between the temperatures T1 and $T2_1$, between the temperatures T1 and $T2_2$, between the temperatures T1 and $T2_3$, etc. are substituted sequentially into the foregoing formula (1). Further, the acceleration factors AF, calculated from results of the accelerated test conducted using the corresponding combinations of the temperatures are substituted into the formula (1) sequentially. By doing so, a plurality of activation energies Ea are calculated, and the calculated activation energies Ea are plotted relative to the values of T2 (namely, $T2_1$, $T2_2$, $T2_3$). As a result, it becomes possible to determine change in activation energy Ea relative to temperatures, as shown in FIG. 5. This change can be used for identifying the temperature T_max at which the activation energy Ea changes from decreasing to increasing (namely, a temperature at which the activation energy Ea is at a minimum).

In the example described above, the accelerated test is conducted while one of the two battery cells 302 is placed at the temperature T1, the other is placed at the temperature T2, and T2 is changed from $T2_1$ to $T2_2$, then to $T2_3$, etc. In this way, a maximum temperature can be determined through implementation of the accelerated test using a small number of the battery cells 302. The accelerated test may be conducted in such a manner as to obtain a result of the accelerated test finally from a plurality of temperature combinations (T1 and $T2_1$, T1 and $T2_2$, T1 and $T2_3$, etc.). For this reason, in addition to one battery cell 302 set at the temperature T1, a plurality of battery cells 302 set at the temperature T2 of different degrees may be prepared in conducting the accelerated test.

For example, among a plurality of battery cells 302 with the minimum capacity C_min, one battery cell 302 may be set at the temperature T1, a different battery cell 302 may be set at the temperature $T2_1$, and a still different battery cell 302 may be set at the temperature $T2_2$. Likewise, still other battery cells may be set at $T2_3$, $T2_4$, etc. Then, the accelerated test may be conducted. The accelerated test may alternatively be conducted by a method of setting one battery cell 302 at the temperature T1, setting a different battery cell 302 initially at the temperature $T2_1$ and then changing the temperature of this battery cell 302 to $T2_2$, and setting a still different battery cell 302 initially at the temperature $T2_3$ and then changing the temperature of this battery cell 302 to $T2_4$, for example.

The temperature T_max identified in this way is usable for conducting an accelerated test on a battery cell of the same species as the battery cell 302 having been used in the accelerated test for the identification (battery cell manufactured by the same manufacturer, belonging to the same model type, belonging to the same lot, for example).

Figure 7:
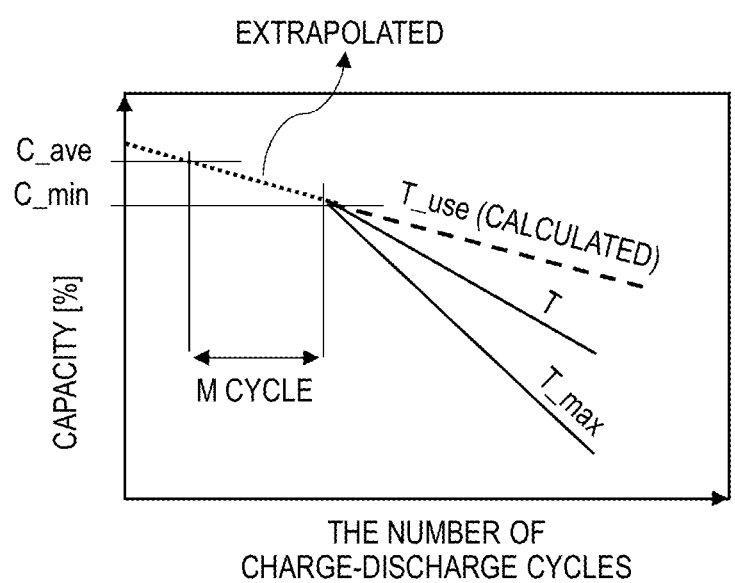
FIG. 7 is an explanatory view of a process of calculating a difference between the number of residual cycles of the battery cell with the average capacity C_ave and the number of residual cycles of the battery cell with the minimum capacity C_min according to the embodiment of the present invention.

FIG. 7 is an explanatory view of a process of calculating a difference between the number of residual cycles of the battery cell 302 with the average capacity C_ave and the number of residual cycles of the battery cell 302 with the minimum capacity C_min according to the embodiment of the present invention.

This calculation is made in step 203 in FIG. 2. Like FIG. 4, FIG. 7 shows a result of the accelerated test conducted at the temperatures T and T_max. The battery estimation system 100 can calculate an acceleration factor AF_use corresponding to a usage temperature T_use by fixing the activation energy Ea in the formula (1) at a value calculated from a result of the foregoing accelerated test. For example, AF calculated by fixing Ea and replacing T with T_use in the formula (1) is the acceleration factor AF_use corresponding to a pair of T_use and T_max.

The usage temperature T_use is an assumed usage temperature in an environment of reuse in which a collected battery cell is to be reused. If the collected battery cell 302 is assumed to be reused in an accumulator battery system, for example, the usage temperature T_use may be a temperature required by a business operator to run this accumulator battery system.

If the acceleration factor AF_use corresponding to a pair of T_use and T_max is calculated in the foregoing manner, for example, by applying the acceleration factor AF_use to a relationship at T_max between the number of cycles and a capacity shown in FIG. 7, a relationship at T_use between the number of cycles and a capacity (rough dashes in FIG. 7) can be calculated in a region in which a capacity is equal to or less than the minimum capacity C_min. Further, by extrapolating the calculated relationship, a relationship at T_use between the number of cycles and a capacity (fine dashes in FIG. 7) can be calculated in a region in which a capacity is equal to or more than the minimum capacity C_min (namely, in a region in which the number of cycles is small).

On the basis of the relationship at the usage temperature T_use between the number of cycles and a capacity calculated in this way, the number of cycles M, required for the capacity of the battery cell 302 with the average capacity C_ave to decrease to the minimum capacity C_min at the usage temperature T_use, is calculated. This corresponds to a difference between the number of residual cycles of the battery cell 302 with the average capacity C_ave and the number of residual cycles of the battery cell 302 with the minimum capacity C_min calculated in step 203.

Figure 8:
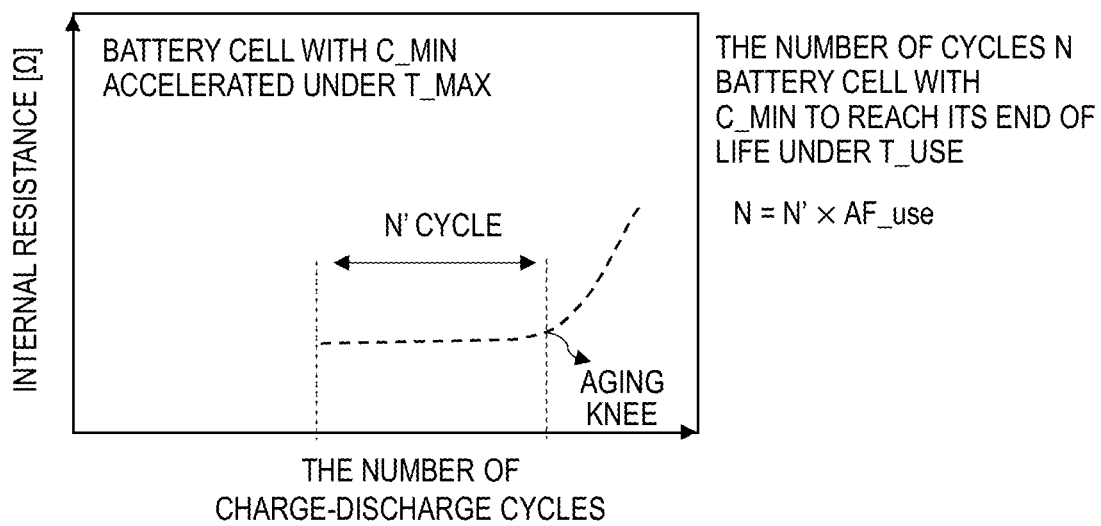
FIG. 8 is an explanatory view of a process of calculating the number of residual cycles of a battery cell with the minimum capacity C_min according to the embodiment of the present invention.

FIG. 8 is an explanatory view of a process of calculating the number of residual cycles of a battery cell with the minimum capacity C_min according to the embodiment of the present invention.

This calculation is made in step 204 in FIG. 2. The graph in FIG. 8 shows a relationship between an internal resistance R (vertical axis) and the number of charge-discharge cycles (horizontal axis) measured during implementation of the accelerated test conducted on the battery cell 302 with the minimum capacity C_min at the maximum temperature T_max.

While the internal resistance R increases little by little in response to increase in the number of charge-discharge cycles, it increases rapidly when a certain number of charge-discharge cycles is exceeded. At this time of the excess, a wear-out failure period is assumed to be started, namely, the battery cell 302 is assumed to have reached an end of its life.

The battery estimation system 100 calculates the number of cycles N' from start of the accelerated test before reach at a point (also called aging knee) at which the internal resistance R starts to increase rapidly. More specifically, a point at which a tilt of the internal resistance R relative to the number of charge-discharge cycles changes to a predetermined reference value or more may be detected as the point at which the internal resistance R starts to increase rapidly, for example. This number of cycles N' is the number of cycles before the battery cell 302 with the minimum capacity C_min reaches an end of its life at the maximum temperature T_max.

Then, the battery estimation system 100 multiplies the number of cycles N' by the acceleration factor AF_use to calculate the number of cycles N before the battery cell 302 with the minimum capacity C_min reaches an end of its life at the usage temperature T_use, namely, the number of residual cycles of a battery cell with the minimum capacity C_min.

The battery estimation system 100 can calculate the number of cycles M+N as the number of residual cycles of the battery cell 302 with the average capacity C_ave by combining the results of the calculations shown in FIGS. 7 and 8. The calculated number may be defined as a residual lifetime of the battery set 301 (step 206). Further, the battery estimation system 100 can predict a distribution of residual lifetimes of the battery cells 302 in the battery set 301 using the decreasing curve of the capacity of the battery cell 302 with the minimum capacity C_min and that of the capacity of the battery cell 302 with the average capacity C_ave.

While the example in FIG. 8 uses the internal resistance R measured when the accelerated test is conducted at the maximum temperature T_max on the battery cell 302 with the minimum capacity C_min, this internal resistance R may be replaced with an internal resistance measured when the accelerated test is conducted at the temperature T on the battery cell 302 with the minimum capacity C_min. In this case, AF_use is calculated by fixing Ea, replacing T with T_use, and replacing T_max with Tin the formula (1), for example. The internal resistance R is an example of a parameter indicating a degree of deterioration of the battery cell 302. The foregoing process may be performed using a different parameter indicating a degree of deterioration of the battery cell 302, instead of the internal resistance R.

Figures 9A, 9B:
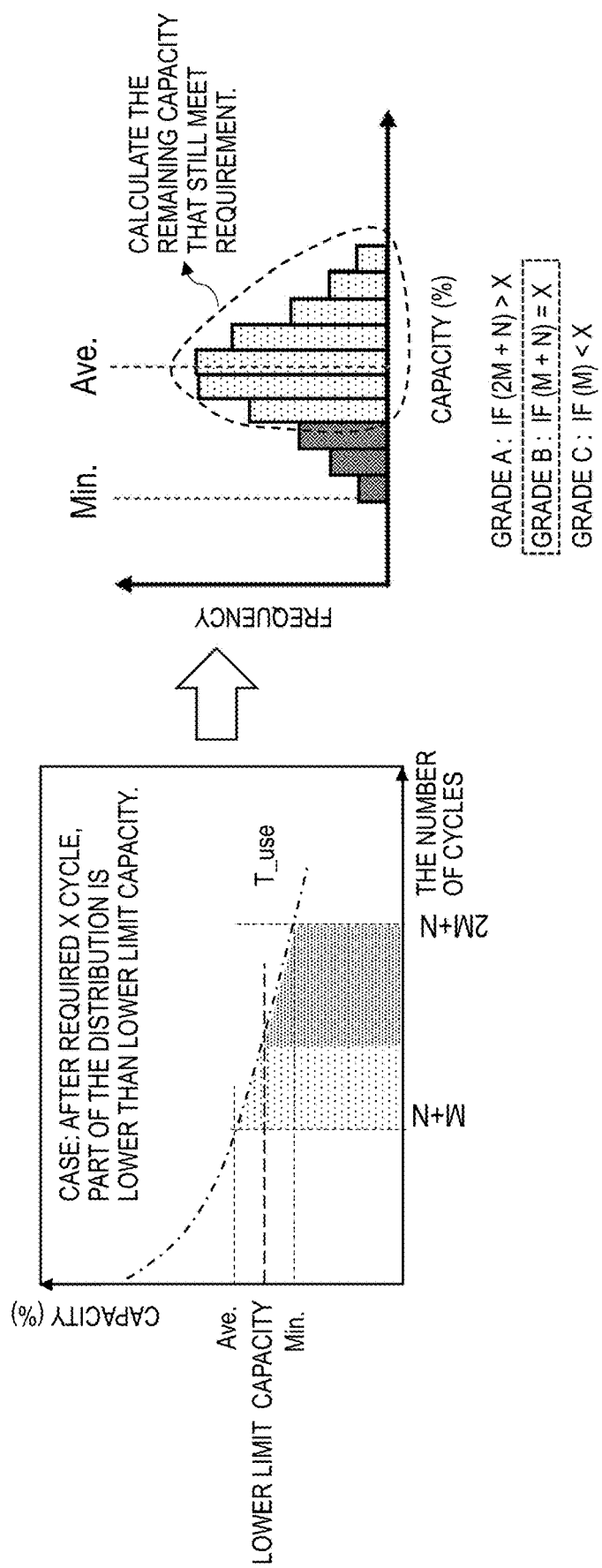
FIG. 9A and FIG. 9B are explanatory views of a process of calculating the viability of the battery cell according to the embodiment of the present invention.

FIG. 9A and FIG. 9B are explanatory views of a process of calculating the viability of the battery cell 302 according to the embodiment of the present invention.

This calculation is made in step 207 in FIG. 2. The battery estimation system 100 judges whether the battery set 301 fulfills a predetermined requirement condition 208. For example, the requirement condition 208 may be fulfilled if "a capacity (SOH) of equal to or more than 30% is left after passage of 10000 charge-discharge cycles from start of reuse of the battery set 301."

The battery estimation system 100 predicts a way in which a distribution of the capacities of the battery cells 302 in the battery set 301 at the present time presumed through the foregoing process changes after charge-discharge cycles are performed a required number of times. This prediction can be made by applying a line (dashes in FIG. 7, for example) indicating a capacity relative to the number of cycles at the usage temperature T_use to a presently presumed distribution of the capacities of the battery cells 302.

The example in FIG. 9A and FIG. 9B show that, in the battery set 301, after charge-discharge cycles are performed a required number of times X, the capacities of some of the battery cells 302 become incapable of fulfilling a required lower limit capacity.

FIG. 9A shows a relationship between the number of cycles and a capacity. In this drawing, a dashed-dotted line is a line indicating a capacity relative to the number of cycles at the usage temperature T_use, and corresponding to the capacity indicated by the dashes in FIG. 7. Regarding the graph in FIG. 9A, the number of charge-discharge cycles at the horizontal axis is determined on the basis of the number of charge-discharge cycles corresponding to the average capacity C_ave shown in FIG. 7 as a starting point (namely, zero). By using this line, prediction can be made on how the capacities of the battery cells 302 in the battery set 301 decrease after charge-discharge cycles are performed the required number of times X.

In the case shown FIG. 9A, X=M+N is defined as a specific example. In this case, the capacity of the battery cell 302, which is at the average capacity C_ave at the time of implementation of the accelerated test (in the explanation given in FIG. 9A and FIG. 9B, this is simply called the battery cell 302 with the average capacity C_ave), decreases to a capacity Ave. corresponding to the number of cycles M+N. On the other hand, the capacity of the battery cell 302, which is at the minimum capacity C_min at the time of implementation of the accelerated test (in the explanation given in FIG. 9A and FIG. 9B, this is simply called the battery cell 302 with the minimum capacity C_min), decreases to a capacity Min. corresponding to the number of cycles 2M+N. On the assumption that the required lower limit capacity is larger than the capacity Min. and smaller than the capacity Ave., after implementation of charge-discharge cycles X times, the capacity of the battery cell 302 with the average capacity C_ave fulfills the required lower limit capacity, whereas the capacity of the battery cell 302 with the minimum capacity C_min becomes incapable of fulfilling the required lower limit capacity.

In this example, the grade of the battery set 301 may be determined on the basis of a relationship among X, M, and N (FIG. 9B). For example, the battery set 301 may be determined to be a top grade A if 2M+N is greater than X, to be a middle grade B if M+N is equal to X, and to be a bottom grade C if M is less than X.

According to the example in FIG. 9B, white parts of a histogram correspond to a distribution of the battery cells 302 still fulfilling the lower limit capacity even after charge-discharge cycles are performed a required number of times. On the basis of this distribution, the residual capacity of the battery set 301 after implementation of the charge-discharge cycles the required number of times can be calculated. By the implementation of such a viability test on the battery set 301, the collected battery set 301 can be classified according to its residual lifetime.

As shown in FIG. 3A to FIG. 3C, according to the foregoing embodiment, a distribution of the capacities (in other words, a distribution of degrees of deterioration) of the battery cells 302 is presumed, and the accelerated test is conducted on battery cells with the smallest capacity (for example, two battery cells 302 belonging to a group of the smallest capacity). However, arbitrary battery cells 302 may be used as targets of the accelerated test, as long as these battery cells 302 are located at positions in a capacity distribution fulfilling the same condition. As an example, the accelerated test may be conducted using the battery cell 302 corresponding to −1σ in a capacity distribution, and a residual lifetime of the battery cell 302 with an average capacity may be presumed on the basis of a result of the accelerated test. In this case, a capacity distribution after implementation of charge-discharge cycles a predetermined number of times shown in FIG. 9A and FIG. 9B are obtained using the battery cell 302 corresponding to −1σ as a reference.

Like the foregoing requirement condition 208 to be fulfilled if "a capacity of equal to or more than 30% is left after passage of 10000 charge-discharge cycles from start of reuse of the battery set 301," for example, a condition set as the requirement condition 208 may not require judgment as to whether the battery cell 302 has reached an end of its life. In this case, even if the battery cell 302 has reached an end of its life before passage of required 10000 charge-discharge cycles, this battery cell 302 fulfills a requirement condition (namely, has viability) as long as a capacity of equal to or more than 30% is left. Like in this case, if estimation of a residual lifetime is not required for judgment of viability, step 206 in FIG. 2 is omissible.

Unlike in the foregoing example, however, the requirement condition 208 may require judgment as to whether the battery cell 302 has reached an end of its life. For example, the requirement condition 208 may be fulfilled if "a ratio of the battery cells 302 not having reached ends of their lives is equal to or more than Y % after passage of X charge-discharge cycles from start of reuse of the battery set 301." In this case, whether the requirement condition 208 is fulfilled (namely, the presence or absence of viability) may be judged on the basis of a result of estimation of a residual lifetime obtained in step 206.

A representative example of the aspect of the present invention described above is summarized as follows. A battery estimation system includes a processor (CPU 101, for example) and a storage device (storage device 102, for example) connected to the processor. The storage device stores accelerated test data (accelerated test data shown in FIG. 6, for example) obtained by measuring change in degree of deterioration (SOH, for example) of a rechargeable battery cell at a predetermined temperature. The processor calculates a relationship (relationship shown in FIG. 5, for example) between the temperature and the magnitude of an activation energy of the rechargeable battery cell (battery cell 302, for example) on the basis of the accelerated test data. The processor calculates a temperature as a maximum temperature (T_max, for example) on the basis of the relationship between the temperature and the magnitude of the activation energy of the rechargeable battery cell. The calculated temperature is a temperature at which the magnitude of the activation energy changes from decreasing to increasing in response to increase in the temperature. The processor determines a temperature equal to or less than the maximum temperature as a temperature to be used in an accelerated test.

As a result, it becomes possible to determine the temperature for the accelerated test conducted for estimating the performance of a second-life rechargeable battery set with unknown usage history with a favorable degree of accuracy in a short time with a light workload.

The accelerated test data may include a result obtained by measuring change in degree of deterioration of a first rechargeable battery cell at a first temperature (T1 in FIG. 6, for example) and a result obtained by measuring change in degree of deterioration of a second rechargeable battery cell at a plurality of second temperatures (T2 in FIG. 6, for example) higher than the first temperature. The processor may calculate a plurality of first acceleration factors on the basis of the change in degree of deterioration of the first rechargeable battery cell at the first temperature and the change in degree of deterioration of the second rechargeable battery cell at the plurality of second temperatures. The processor may calculate the relationship between the temperature and the magnitude of the activation energy of the rechargeable battery cell by applying the plurality of first acceleration factors, the first temperature, and the plurality of second temperatures to an Arrhenius' equation (formula (1)) and calculating the magnitudes of a plurality of activation energies corresponding to the plurality of second temperatures.

As a result, it becomes possible to calculate the maximum temperature from the accelerated test data using samples of a small number of rechargeable battery cells.

The storage device may store a result (data indicated by T in FIG. 4, for example) obtained by measuring change in degree of deterioration of a third rechargeable battery cell at a third temperature and a result (data indicated by T_max in FIG. 4, for example) obtained by measuring change in degree of deterioration of a fourth rechargeable battery cell at a fourth temperature higher than third temperature and equal to or less than the maximum temperature. The results are stored as accelerated test data indicating a result of an accelerated test conducted after calculation of the maximum temperature. The storage device may store information (distribution in FIG. 3C, for example) indicating degrees of present deterioration of a plurality of rechargeable battery cells including the third rechargeable battery cell and the fourth rechargeable battery cell. The third rechargeable battery cell and the fourth rechargeable battery cell belonging to the plurality of rechargeable battery cells may be two rechargeable battery cells that are located at positions in a distribution of degrees of present deterioration of the plurality of rechargeable battery cells fulfilling the same condition (belonging to a group of the smallest capacity or having a capacity corresponding to −1σ in the distribution, for example). The processor may calculate a second acceleration factor (acceleration factor between T and T_max obtained from the accelerated test in FIG. 7, for example) on the basis of the change in degree of deterioration of the third rechargeable battery cell at the third temperature and the change in degree of deterioration of the fourth rechargeable battery cell at the fourth temperature. The processor may predict change in degree of deterioration of the plurality of rechargeable battery cells (dashed part in FIG. 7, for example) at a fifth temperature (T_use, for example) lower than the third temperature on the basis of the second acceleration factor.

As a result, it becomes possible to estimate the performance of a second-life rechargeable battery with a favorable degree of accuracy using the accelerated test data measured in a relatively short period of time.

The processor may predict residual lifetimes of the plurality of rechargeable battery cells on the basis of the predicted change in degree of deterioration of the plurality of rechargeable battery cells at the fifth temperature (step 206, for example), and may determine the viabilities of the plurality of rechargeable battery cells on the basis of the predicted residual lifetimes of the plurality of the rechargeable battery cells and a predetermined requirement condition (requirement condition 208, for example) (step 207, for example).

As a result, the performance of a second-life rechargeable battery is estimated on the basis of a residual lifetime.

The information indicating degrees of present deterioration of the plurality of rechargeable battery cells including the third rechargeable battery cell and the fourth rechargeable battery cell may include at least information indicating the present capacities (SOH, for example) of the plurality of rechargeable battery cells. The third rechargeable battery cell and the fourth rechargeable battery cell may be two rechargeable battery cells (battery cells 302 corresponding to the capacity C_min in the distribution in FIG. 3C, for example) belonging to a group of the smallest capacity in a distribution of the present capacities of the plurality of rechargeable battery cells. The accelerated test data may include a result obtained by measuring change in capacity relative to the number of charge-discharge cycles of the third rechargeable battery cell at the third temperature (capacity relative to the number of charge-discharge cycles corresponding to the temperature T in FIG. 7, for example). The accelerated test data may include a result obtained by measuring change in capacity relative to the number of charge-discharge cycles of the fourth rechargeable battery cell at the fourth temperature (capacity relative to the number of charge-discharge cycles corresponding to the temperature T_max in FIG. 7, for example). The accelerated test data may include at least one of a result obtained by measuring change in internal resistance relative to the number of charge-discharge cycles of the third rechargeable battery cell at the third temperature and a result obtained by measuring change in internal resistance relative to the number of charge-discharge cycles of the fourth rechargeable battery cell at the fourth temperature (FIG. 8, for example). The processor may predict change in capacity relative to the number of charge-discharge cycles of the plurality of rechargeable battery cells at the fifth temperature (dashed part in FIG. 7, for example) by applying the second acceleration factor, the third temperature or the fourth temperature, and the fifth temperature to the Arrhenius' equation. On the basis of a result of the prediction, the processor may calculate the number of charge-discharge cycles (the number of cycles M in FIG. 7, for example) required for the capacity of a rechargeable battery cell having an average capacity in a distribution of the capacities of the plurality of rechargeable battery cells to decrease to the capacity of a rechargeable battery cell belonging to the group of the smallest capacity at the fifth temperature. On the basis of the change in internal resistance relative to the number of charge-discharge cycles of the third rechargeable battery cell at the third temperature or the change in internal resistance relative to the number of charge-discharge cycles of the fourth rechargeable battery cell at the fourth temperature, the processor may calculate the number of charge-discharge cycles (the number of cycles N' in FIG. 8, for example) before a rechargeable battery cell belonging to the group of the smallest capacity reaches an end of its life at the third temperature or the fourth temperature. On the basis of the change in capacity relative to the number of charge-discharge cycles of the third rechargeable battery cell at the third temperature or the change in capacity relative to the number of charge-discharge cycles of the fourth rechargeable battery cell at the fourth temperature, and the predicted change in capacity relative to the number of charge-discharge cycles of the plurality of rechargeable battery cells at the fifth temperature, the processor may calculate a third acceleration factor (AF_use, for example) between the third temperature or the fourth temperature and the fifth temperature. On the basis of the number of charge-discharge cycles (the number of cycles M in FIG. 7, for example) required for the capacity of a rechargeable battery cell having an average capacity in the distribution of the capacities of the plurality of rechargeable battery cells to decrease to the capacity of a rechargeable battery cell belonging to the group of the smallest capacity at the fifth temperature, the number of charge-discharge cycles (the number of cycles N' in FIG. 8, for example) before a rechargeable battery cell belonging to the group of the smallest capacity reaches an end of its life at the third temperature or the fourth temperature, and the third acceleration factor (AF_use, for example), the processor may calculate the number of charge-discharge cycles (the number of cycles N in FIG. 8, for example) before a rechargeable battery cell having an average capacity reaches an end of its life at the fifth temperature.

As a result, it becomes possible to estimate the performance of a second-life rechargeable battery with a favorable degree of accuracy using the accelerated test data measured in a relatively short period of time.

The processor may predict a distribution of degrees of deterioration of the plurality of rechargeable battery cells (distribution in FIG. 9B, for example) after the plurality of rechargeable battery cells is used under a required condition on the basis of the predicted change in degree of deterioration of the plurality of rechargeable battery cells at the fifth temperature. The processor may determine the viabilities of the plurality of rechargeable battery cells on the basis of the predicted distribution of degrees of deterioration of the plurality of rechargeable battery cells (step 207, for example).

As a result, the performance of a second-life rechargeable battery is estimated on the basis of change in distribution of degrees of deterioration.

The first rechargeable battery cell, the second rechargeable battery cell, the third rechargeable battery cell, and the fourth rechargeable battery cell may be rechargeable battery cells of the same species.

As a result, it becomes possible to shorten test time by using the maximum temperature in an accelerated test on a rechargeable battery cell of the same species after the maximum temperature is calculated once.

The plurality of rechargeable battery cells including the third rechargeable battery cell and the fourth rechargeable battery cell may be rechargeable battery cells constituting one rechargeable battery set having been used in one electric device.

The one electric device may be one electric vehicle.

As a result, the viability of a rechargeable battery cell is estimated when the rechargeable battery cell is to be reused after being used in an electric device such as an electric vehicle and then collected.

The fifth temperature may be a usage temperature at which the plurality of rechargeable battery cells is to be reused.

As a result, viability is estimated under a condition of reusing a collected rechargeable battery.

The present invention is not to be limited to the foregoing embodiment but it includes various modifications. For example, while the foregoing embodiment has been described in detail for better understanding of the present invention, the present invention is not always limited to a configuration including all the structures in the description. Additionally, a part of a structure in one embodiment can be replaced with a structure in a different embodiment, and a structure in one embodiment can be added to a structure in a different embodiment. Further, a part of a structure in each embodiment can be subjected to addition by a different structure, deletion, or replacement with a different structure.

All structures, functions, processors, processing means, etc. described above may be realized by hardware by being designed partially or entirely using an integrated circuit, for example. All the structures, functions, etc. described above may alternatively be realized by software by causing a processor to interpret and execute a program for realizing each function. Information such as a program, a table, or a file for realizing each function can be stored into a storage device such as a nonvolatile semiconductor memory, a hard disk drive, or a solid state drive (SSD), for example, or into a non-transitory data storage medium readable by a computer such as an IC card, an SD card, or a DVD, for example.

The illustrated control lines and information lines mean that these lines are necessary for the description. The illustrated control lines and information lines do not always include all control lines and information lines in a product. It can be considered that substantially all structures are actually connected to each other.

What is claimed is:

1. A battery estimation system comprising a processor and a storage device coupled to the processor,
   wherein the storage device stores accelerated test data obtained by measuring change in degree of deterioration of a rechargeable battery cell at a predetermined temperature,
   wherein the processor is configured to:
   calculate a relationship between the temperature of the rechargeable battery cell and the magnitude of an activation energy of the rechargeable battery cell on the basis of the accelerated test data;
   calculate a temperature as a maximum temperature on the basis of the relationship between the temperature of the rechargeable battery cell and the magnitude of the activation energy of the rechargeable battery cell, the calculated temperature being a temperature at which the magnitude of the activation energy changes from decreasing to increasing in response to increase in the temperature; and
   determine a temperature equal to or less than the maximum temperature as a temperature to be used in an accelerated test.

2. The battery estimation system according to claim 1,
   wherein the accelerated test data includes a result obtained by measuring change in degree of deterioration of a first rechargeable battery cell at a first temperature and a result obtained by measuring change in degree of deterioration of a second rechargeable battery cell at a plurality of second temperatures higher than the first temperature,
   wherein the processor is further configured to:
   calculate a plurality of first acceleration factors on the basis of the change in degree of deterioration of the first rechargeable battery cell at the first temperature and the change in degree of deterioration of the second rechargeable battery cell at the plurality of second temperatures; and
   calculate the relationship between the temperature and the magnitude of the activation energy of the rechargeable battery cell by applying the plurality of first acceleration factors, the first temperature, and the plurality of second temperatures to an Arrhenius' equation and calculating the magnitudes of a plurality of activation energies corresponding to the plurality of second temperatures.

3. The battery estimation system according to claim 2, wherein the storage device stores a result obtained by measuring change in degree of deterioration of a third rechargeable battery cell at a third temperature and a result obtained by measuring change in degree of deterioration of a fourth rechargeable battery cell at a fourth temperature higher than third temperature and equal to or less than the maximum temperature, the results being stored as accelerated test data indicating a result of an accelerated test conducted after calculation of the maximum temperature, wherein the storage device stores information indicating degrees of present deterioration of a plurality of rechargeable battery cells including the third rechargeable battery cell and the fourth rechargeable battery cell, wherein the third rechargeable battery cell and the fourth rechargeable battery cell belonging to the plurality of rechargeable battery cells are two rechargeable battery cells that are located at positions in a distribution of degrees of present deterioration of the plurality of rechargeable battery cells fulfilling the same condition, wherein the processor is further configured to:

calculate a second acceleration factor on the basis of the change in degree of deterioration of the third rechargeable battery cell at the third temperature and the change in degree of deterioration of the fourth rechargeable battery cell at the fourth temperature; and predict change in degree of deterioration of the plurality of rechargeable battery cells at a fifth temperature lower than the third temperature on the basis of the second acceleration factor.

4. The battery estimation system according to claim 3, wherein the processor is further configured to:

predict residual lifetimes of the plurality of rechargeable battery cells on the basis of the predicted change in degree of deterioration of the plurality of rechargeable battery cells at the fifth temperature; and determine the viabilities of the plurality of rechargeable battery cells on the basis of the predicted residual lifetimes of the plurality of the rechargeable battery cells and a predetermined requirement condition.

5. The battery estimation system according to claim 4, wherein the information indicating degrees of present deterioration of the plurality of rechargeable battery cells including the third rechargeable battery cell and the fourth rechargeable battery cell includes at least information indicating the present capacities of the plurality of rechargeable battery cells, wherein the third rechargeable battery cell and the fourth rechargeable battery cell are two rechargeable battery cells belonging to a group of the smallest capacity in a distribution of the present capacities of the plurality of rechargeable battery cells, wherein the accelerated test data includes a result obtained by measuring change in capacity relative to the number of charge-discharge cycles of the third rechargeable battery cell at the third temperature, wherein the accelerated test data includes a result obtained by measuring change in capacity relative to the number of charge-discharge cycles of the fourth rechargeable battery cell at the fourth temperature, wherein the accelerated test data includes at least one of a result obtained by measuring change in internal resistance relative to the number of charge-discharge cycles of the third rechargeable battery cell at the third temperature and a result obtained by measuring change in internal resistance relative to the number of charge-discharge cycles of the fourth rechargeable battery cell at the fourth temperature, wherein the processor is further configured to:

predict change in capacity relative to the number of charge-discharge cycles of the plurality of rechargeable battery cells at the fifth temperature by applying the second acceleration factor, the third temperature or the fourth temperature, and the fifth temperature to the Arrhenius' equation;

calculate the number of charge-discharge cycles required for the capacity of a rechargeable battery cell having an average capacity in a distribution of the capacities of the plurality of rechargeable battery cells to decrease to the capacity of a rechargeable battery cell belonging to the group of the smallest capacity at the fifth temperature on the basis of a result of the prediction;

calculate the number of charge-discharge cycles before a rechargeable battery cell belonging to the group of the smallest capacity reaches an end of its life at the third temperature or the fourth temperature on the basis of the change in internal resistance relative to the number of charge-discharge cycles of the third rechargeable battery cell at the third temperature or the change in internal resistance relative to the number of charge-discharge cycles of the fourth rechargeable battery cell at the fourth temperature;

calculate a third acceleration factor between the third temperature or the fourth temperature and the fifth temperature on the basis of the change in capacity relative to the number of charge-discharge cycles of the third rechargeable battery cell at the third temperature or the change in capacity relative to the number of charge-discharge cycles of the fourth rechargeable battery cell at the fourth temperature, and the predicted change in capacity relative to the number of charge-discharge cycles of the plurality of rechargeable battery cells at the fifth temperature; and calculate the number of charge-discharge cycles before a rechargeable battery cell having an average capacity reaches an end of its life at the fifth temperature on the basis of the number of charge-discharge cycles required for the capacity of a rechargeable battery cell having an average capacity in the distribution of the capacities of the plurality of rechargeable battery cells to decrease to the capacity of a rechargeable battery cell belonging to the group of the smallest capacity at the fifth temperature, the number of charge-discharge cycles before a rechargeable battery cell belonging to the group of the smallest capacity reaches an end of its life at the third temperature or the fourth temperature, and the third acceleration factor.

6. The battery estimation system according to claim 3, wherein the processor is further configured to:

predict a distribution of degrees of deterioration of the plurality of rechargeable battery cells after the plurality of rechargeable battery cells is used under a required condition on the basis of the predicted change in degree of deterioration of the plurality of rechargeable battery cells at the fifth temperature, and determine the viabilities of the plurality of rechargeable battery cells on the basis of the predicted distribution of degrees of deterioration of the plurality of rechargeable battery cells.

7. The battery estimation system according to claim 3, wherein the first rechargeable battery cell, the second rechargeable battery cell, the third rechargeable battery cell, and the fourth rechargeable battery cell are rechargeable battery cells of the same type.

8. The battery estimation system according to claim 7, wherein the plurality of rechargeable battery cells including the third rechargeable battery cell and the fourth rechargeable battery cell are rechargeable battery cells constituting one rechargeable battery set having been used in one electric device.

9. The battery estimation system according to claim 8, wherein the one electric device is one electric vehicle.

10. The battery estimation system according to claim 3, wherein the fifth temperature is a usage temperature at which the plurality of rechargeable battery cells is to be reused.

11. A battery estimation method executed by a battery estimation system comprising a processor and a storage device coupled to the processor, the storage device storing accelerated test data obtained by measuring change in degree of deterioration of a rechargeable battery cell at a predetermined temperature, the battery estimation method comprising:

a step performed by the processor of calculating a relationship between the temperature of the rechargeable battery cell and the magnitude of an activation energy of the rechargeable battery cell on the basis of the accelerated test data;

a step performed by the processor of calculating a temperature as a maximum temperature on the basis of the relationship between the temperature of the rechargeable battery cell and the magnitude of the activation energy of the rechargeable battery cell, the calculated temperature being a temperature at which the magnitude of the activation energy changes from decreasing to increasing in response to increase in the temperature; and a step performed by the processor of determining a temperature equal to or less than the maximum temperature as a temperature to be used in an accelerated test.

12. A non-transitory computer-readable storage medium that stores a program that control a computer system, wherein the computer system comprising a processor and a storage device coupled to the processor, wherein the storage device storing accelerated test data obtained by measuring change in degree of deterioration of a rechargeable battery cell at a predetermined temperature, wherein the program is configured to cause the processor to perform:

a step of calculating a relationship between the temperature of the rechargeable battery cell and the magnitude of an activation energy of the rechargeable battery cell on the basis of the accelerated test data;

a step of calculating a temperature as a maximum temperature on the basis of the relationship between the temperature of the rechargeable battery cell and the magnitude of the activation energy of the rechargeable battery cell, the calculated temperature being a temperature at which the magnitude of the activation energy changes from decreasing to increasing in response to increase in the temperature; and a step of determining a temperature equal to or less than the maximum temperature as a temperature to be used in an accelerated test.

\* \* \* \* \*